(12) United States Patent
Doi et al.

(10) Patent No.: US 9,059,405 B2
(45) Date of Patent: Jun. 16, 2015

(54) FERROELECTRIC THIN FILM-FORMING SOL-GEL SOLUTION

(71) Applicant: MITSUBISHI MATERIALS CORPORATION, Tokyo (JP)

(72) Inventors: Toshihiro Doi, Naka (JP); Hideaki Sakurai, Naka (JP); Toshiaki Watanabe, Sanda (JP); Nobuyuki Soyama, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 174 days.

(21) Appl. No.: 13/829,125

(22) Filed: Mar. 14, 2013

(65) Prior Publication Data

US 2013/0256580 A1    Oct. 3, 2013

(30) Foreign Application Priority Data

Mar. 30, 2012  (JP) .................. 2012-078920

(51) Int. Cl.
- *C04B 35/491* (2006.01)
- *H01B 3/12* (2006.01)
- *H01L 41/187* (2006.01)
- *C23C 18/12* (2006.01)

(52) U.S. Cl.
CPC ........ *H01L 41/1876* (2013.01); *C23C 18/1216* (2013.01); *C23C 18/1254* (2013.01)

(58) Field of Classification Search
USPC ............... 252/62.9 PZ; 427/100; 106/287.19, 106/287.23, 287.12
See application file for complete search history.

(56) References Cited

U.S. PATENT DOCUMENTS 4,710,227 A * 12/1987 Harley et al. ................... 149/47

FOREIGN PATENT DOCUMENTS

JP    2001-261338 A    9/2001

OTHER PUBLICATIONS

A. Yamano et al., "Single-step sol-gel deposition and dielectric properties of 0.4 μm thick, (001) oriented Pb(Zr,Ti)$O_3$ thin films," J Sol-Gel Sci Technol (2008) 47: pp. 316-325.

* cited by examiner

*Primary Examiner* — Carol M Koslow
(74) *Attorney, Agent, or Firm* — Locke Lord LLP; James E. Armstrong, IV; Nicholas J. DiCeglie, Jr.

(57) ABSTRACT

When a ferroelectric thin film-forming sol-gel solution contains a PZT-based compound, a viscosity-adjusting macromolecular compound including polyvinylpyrrolidone, and an organic dopant including a formamide-based solvent, the PZT-based compound is included at 17 mass % or more in terms of an oxide, the molar ratio of the polyvinylpyrrolidone to the PZT-based compound is PZT-based compound:polyvinylpyrrolidone=1:0.1 to 0.5 in terms of a monomer, and the formamide-based solvent is included at 3 mass % to 13 mass % of the sol-gel solution, it is possible to form a thick layer by coating the sol-gel solution once, the production efficiency improves, and crack-free and dense film formation even after calcination and firing becomes possible.

6 Claims, 6 Drawing Sheets

US 9,059,405 B2

FERROELECTRIC THIN FILM-FORMING SOL-GEL SOLUTION

TECHNICAL FIELD

The present invention relates to a ferroelectric thin film-forming sol-gel solution which can produce a crack-free and dense ferroelectric thin film after calcination and firing even in a case in which the film is formed to be more than several hundreds of nanometers thick per layer by coating a ferroelectric thin film-forming sol-gel solution once using a Chemical Solution Deposition (CSD) method.

BACKGROUND ART

In the past, in the CSD method, for example, a sol-gel method, in a case in which a PZT-based ferroelectric thin film (abbreviated to "PZT film") was formed on a substrate, the limitation on the thickness of the thin film formed by coating a PZT-based ferroelectric thin film-forming sol-gel solution (abbreviated to "sol-gel solution") once was approximately 100 nm. This is because, when a film having a thickness of more than 100 nm is calcined and fired, tensile stress generated in the PZT film is generated unevenly in the same film, and, consequently, cracking often occurs in the film.

Therefore, in order to obtain a PZT film having a film thickness of several μm, it is necessary to form a thinner layer, carry out coating several tens of times, and repeat calcination and firing. However, since the production efficiency decreases in such a method, the film-forming costs increase.

As a result, to deal with the above disadvantage, a sol-gel solution which uses propylene glycol as an organic solvent used for preparing a sol-gel solution and can produce a thick film having a thickness of 200 nm or more per layer when coated once is proposed (for example, refer to Patent Document 1). In addition, a method is proposed in which a macromolecule is added to a high-concentration sol-gel solution so as to alleviate tensile stress generated during film formation, whereby a thick layer can be coated by coating a sol-gel solution once (for example, refer to Non Patent Document J Sol-Gel Sci Technol (2008) 47:316-325).

RELATED ART DOCUMENT

Patent Document

[Patent Document 1] JP-A-2001-261338 (claim 1, Paragraphs [0016] to [0024], Table 1)

Non Patent Document

[Non Patent Document 1] J Sol-Gel Sci Technol (2008) 47:316-325

DISCLOSURE OF THE INVENTION

Problem that the Invention is to Solve

However, the present inventors found that, even when the sol-gel solution proposed above is used, it is difficult to manufacture a PZT film having a crack-free and dense film structure and having sufficient practical characteristics.

An object of the invention is to provide a ferroelectric thin film-forming sol-gel solution which can produce a crack-free and dense PZT film after calcination and firing even in a case in which the film is formed to be more than several hundreds of nanometers thick per layer by coating a sol-gel solution once.

Means for Solving the Problems

A first aspect of the invention is a ferroelectric thin film-forming sol-gel solution containing a PZT-based compound, a viscosity-adjusting macromolecular compound including polyvinylpyrrolidone, and an organic dopant including a formamide-based solvent, in which the PZT-based compound is included at 17 mass % or more in terms of an oxide, the molar ratio of the polyvinylpyrrolidone to the PZT-based compound is PZT-based compound:polyvinylpyrrolidone=1:0.1 to 0.5 in terms of a monomer, and the formamide-based solvent is included at 3 mass % to 13 mass % of the sol-gel solution.

A second aspect of the invention is an invention based on the first aspect and the ferroelectric thin film-forming sol-gel solution, in which, furthermore, the formamide-based solvent is formamide, N-methylformamide or N,N-dimethylformamide.

A third aspect of the invention is an invention based on the first aspect and the ferroelectric thin film-forming sol-gel solution according to the first aspect, in which, furthermore, the k value of the polyvinylpyrrolidone is in a range of 15 to 90. Here, the k value refers to a viscosity characteristic value related to the molecular weight, and is a value obtained by computing a relative viscosity value (25° C.), measured using a capillary viscometer using the following Fikentscher formula.

$$k \text{ value} = (1.5 \log \eta \text{rel} - 1)/(0.15 + 0.003c) + (300c \log \eta \text{rel} + (c + 1.5c \log \eta \text{rel})^2)^{1/2}/(0.15c + 0.003c^2)$$

(ηrel; the relative viscosity of an aqueous solution of polyvinylpyrrolidone with respect to water, c; the concentration of polyvinylpyrrolidone in an aqueous solution of polyvinylpyrrolidone (%))

A fourth aspect of the invention is a method of forming a ferroelectric thin film using the ferroelectric thin film-forming sol-gel solution based on any one of the first to third aspects.

Advantage of the Invention

Since the ferroelectric thin film-forming sol-gel solution according to the first aspect of the invention contains a PZT-based compound, a viscosity-adjusting macromolecular compound including polyvinylpyrrolidone, and an organic dopant including a formamide-based solvent, which is a polar solvent, the PZT-based compound is included at 17 mass % or more in terms of an oxide, the molar ratio of the polyvinylpyrrolidone to the PZT-based compound is PZT-based compound:polyvinylpyrrolidone=1:0.1 to 0.5 in terms of a monomer, and the formamide-based solvent is included at 3 mass % to 13 mass % of the sol-gel solution, when the sol-gel solution is used to manufacture a PZT-based ferroelectric thin film, it is possible to manufacture a PZT film which has a crack-free and dense film structure and has sufficient practical characteristics.

Since the ferroelectric thin film-forming sol-gel solution according to the second aspect of the invention is an invention based on the first aspect, and is the ferroelectric thin film-forming sol-gel solution in which, furthermore, the formamide-based solvent is formamide, N-methylformamide or N,N-dimethylformamide, when the sol-gel solution is used to manufacture a PZT-based ferroelectric thin film, it is possible to manufacture a better PZT film which has a crack-free and dense film structure and has sufficient practical characteristics.

Since the ferroelectric thin film-forming sol-gel solution according to the third aspect of the invention is an invention based on the first aspect, and, furthermore, the k value of the polyvinylpyrrolidone is in a range of 15 to 90, when the sol-gel solution is used to manufacture a PZT-based ferroelectric thin film, it is possible to manufacture a better PZT film which has a crack-free and dense film structure and has sufficient practical characteristics.

In the method of forming a ferroelectric thin film according to the fourth aspect of the invention, it is possible to manufacture a better PZT film which has a crack-free and dense film structure and has sufficient practical characteristics.

BEST MODE FOR CARRYING OUT THE INVENTION

Figure 1:
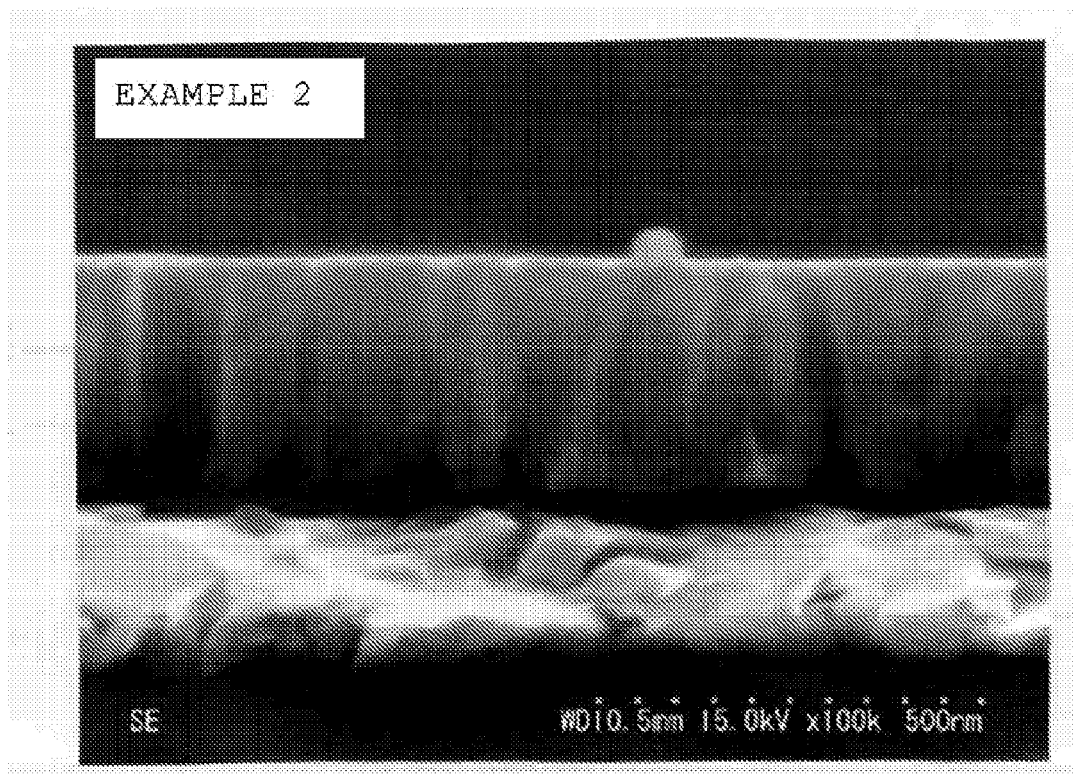
FIG. 1 is an image of a cross-section of a PZT-based ferroelectric thin film according to Example 2 of the invention observed using a SEM photograph.

A ferroelectric thin film-forming sol-gel solution according to the present embodiment will be hereinafter described using a PZT-based ferroelectric thin film-forming sol-gel solution (hereinafter abbreviated to "PZT-based sol-gel solution") as a typical example.

The PZT-based sol-gel solution according to the embodiment is a sol-gel solution which contains a PZT-based compound, a viscosity-adjusting macromolecular compound including polyvinylpyrrolidone (PVP), and an organic dopant including a formamide-based solvent, in which the PZT-based compound is included at 17 mass % or more in terms of an oxide, the molar ratio of the polyvinylpyrrolidone to the PZT-based compound is PZT-based compound:polyvinylpyrrolidone =1:0.1 to 0.5 in terms of a monomer, and the formamide-based solvent is included at 3 mass % to 13 mass % of the sol-gel solution.

First, the PZT-based compound, the viscosity-adjusting macromolecular compound including polyvinylpyrrolidone, and the organic dopant including a formamide-based solvent, which are basic ingredients of the PZT-based sol-gel solution, will be described.

Examples of the PZT-based compound include non-PZT compounds such as PLZT, PMnZT and PNbZT. The raw material of the PZT-based compound is preferably a compound in which organic groups are bonded to the respective metal elements of Pb, La, Zr and Ti through oxygen or nitrogen atoms thereof. Examples thereof include one or two or more selected from a group consisting of metal alkoxides, metal diol complexes, metal triol complexes, metal carboxylates, metal β-diketonate complexes, metal β-diketoester complexes, metal β-iminoketo complexes and metal amino complexes. A particularly preferable compound is a metal alkoxide, a partial hydrolysate thereof, or an organic acid salt.

Among the above, examples of a Pb compound and a La compound include acetates (lead acetate: $Pb(OA_C)_2$, lanthanum acetate: $La(OA_C)_3$), lead diisopropoxide: $Pb(OiPr)_2$, lanthanum triisopropoxide: $La(OiPr)_3$, and the like. Examples of a Ti compound include alkoxides such as titanium tetraethoxide: $Ti(OEt)_4$, titanium tetraisopropoxide: $Ti(OiPr)_4$, titanium tetra n-butoxide: $Ti(OiBu)_4$, titanium tetraisobutoxide: $Ti(OiBu)_4$, titanium tetra t-butoxide: $Ti(OtBu)_4$, and titanium dimethoxy diisopropoxide: $Ti(OMe)_2(OiPr)_2$. As a Zr compound, the same alkoxides as for the Ti compound are preferable. The metal alkoxide may be used as it is, but a partial hydrolysate thereof may be used in order to accelerate decomposition.

The polyvinylpyrrolidone (PVP) is a compound having an adjustable liquid viscosity. More specifically, the relative viscosity can be determined and adjusted using the above k value. In the embodiment, the k value is preferably in a range of 15 to 90. When the k value is less than 15, the k value is not enough to obtain a sufficient viscosity for obtaining a thick film, which creates a disadvantage, and, when the k value exceeds 90, the viscosity is too high such that there is a disadvantage that it becomes difficult to evenly coat the sol-gel solution. As the macromolecular compound, polyethylen glycol or the like having a degree of polymerization of 100 to 1000 is used. When the degree of polymerization is less than 100, a sufficient viscosity cannot be obtained, which creates a disadvantage, and, when the degree of polymerization exceeds 1000, the viscosity is too high such that there is a disadvantage that it becomes difficult to evenly coat the sol-gel solution.

As the organic dopant including a formamide-based solvent, any of formamide, N-methylformamide, and N,N-dimethylamide is preferably used. When the organic dopant is combined with the polyvinylpyrrolidone, it is possible to manufacture a PZT-based sol-gel solution which can form a crack-free and dense PZT film after calcination and firing even in a case in which the film is formed to be more than several hundreds of nanometers thick per layer by coating the sol-gel solution once, which is the object of the invention. The organic dopant is preferably an ethanolamine, such as monoethanolamine or diethanoleamine. This is because the ethanolamine has an effect of increasing the storage stability of the solution by being coordinated around the metal alkoxide.

Next, the prescription of the basic ingredients into the PZT-based sol-gel solution will be described.

First, the PZT compound is included at 17 mass % in terms of an oxide in the PZT-based sol-gel solution. This is because, when the PZT compound is included at less than 17 mass %, there is a disadvantage that the concentration of a precursor material is low, and a sufficient film thickness cannot be obtained. The PZT compound is preferably included at 23 mass % or less. This is because, when the PZT compound is included at more than 23 mass %, there is a disadvantage that the fraction of a lower alcohol, which is a diluent, decreases such that there is a concern that coated film properties or storage stability may deteriorate.

Next, the molar ratio of the polyvinylpyrrolidone to the PZT-based compound is made to be PZT-based compound: polyvinylpyrrolidone=1:0.1 to 0.5 in terms of a monomer.

This is because, when the molar ratio is 1:less than 0.1, a sufficient viscosity cannot be obtained such that there is a disadvantage that stress is not alleviated, and cracking occurs, and when the molar ratio is 1:more than 0.5, there is a disadvantage that a number of voids are generated in the film. More preferably, it is possible to make PZT-based compound:polyvinylpyrrolidone=1:0.2 to 0.45. This is because, when the molar ratio is 1:less than 0.2, the range of the process temperature is narrow such that there is a disadvantage that cracking becomes liable to occur, and when the molar ratio is 1:more than 0.45, there is a disadvantage that, sometimes, voids are slightly generated.

In addition, the formamide-based solvent is included at 3 mass % to 13 mass % of the PZT-based sol-gel solution. This is because, when the formamide-based solvent is included at less than 3 mass %, the addition amount is not sufficient such that there is a disadvantage that it is not possible to suppress occurrence of cracking, and, when the formamide-based solvent is included at more than 13 mass %, the solution is excessively diluted such that there is a disadvantage that the thickness of a coated film per layer becomes thin. More preferably, it is possible to set the content of the formamide-based solvent to 6.5 mass % to 10 mass %. This is because, when the formamide-based solvent is included at less than 6.5 mass %, there is a disadvantage that cracking is liable to occur, and, when the formamide-based solvent is included at more than 10 mass %, there is a disadvantage that the thickness of a coated film per layer becomes thin.

Furthermore, a method of preparing a raw material liquid of the PZT-based sol-gel solution containing the PZT-based compound according to the basic ingredients and the above prescription will be described.

The raw material liquid of the PZT-based sol-gel solution is prepared using the following liquid synthesis flow. First, a Zr source, a Ti source, and a stabilizer are put into a reaction vessel, and are refluxed in a nitrogen atmosphere. Next, a Pb source is added to the refluxed compound, a solvent is added, the solution is refluxed in a nitrogen atmosphere, is distilled under reduced pressure so as to remove byproducts, then, propylene glycol is further added to the solution so as to adjust the concentration, and, furthermore, ethanol is added to this solution. More typically, predetermined weights of $Pb(CH_3COO)_3 \cdot 3H_2O$, $Zr(Oi-Pr)_4$, and $Ti(Oi-Pr)_4$ are weighed respectively so as to make the composition ratio Pb/Zr/Ti of the PZT-based compound become 115/52/48 respectively (17 mass % or more in terms of an oxide), and the mixture is dissolved in a solvent, such as ethanol, thereby obtaining the raw material solution. A stabilizer is added to the raw material solution as necessary, which will be described below.

Next, addition and mixing of additive included in the raw material solution will be described.

In the PZT-based sol-gel solution according to the embodiment, the viscosity-adjusting macromolecular compound including polyvinylpyrrolidone is added to the raw material solution obtained in the above manner so that the molar ratio becomes PZT:polyvinylpyrrolidone =1:0.1 to 0.5 in terms of a monomer. The reason for the above molar ratio is as described above. After polyvinylpyrrolidone is added to the raw material solution at the above molar ratio, the solution is stirred at room temperature for 24 hours. In addition, the organic dopant including a formamide-based solvent, which is any of formamide, N-methylformamide and N,N-dimethylamide, is added so as to obtain a concentration of 3 mass % to 13 mass % of the PZT-based sol-gel solution, stirred for 2 hours, and then stabilized at room temperature for 24 hours.

In addition, a stabilizer to be included or a solvent being used is as described below. To the PZT-based sol-gel solution, a β-diketone (for example, acetylacetone, heptafluorobutanoylpivaroyl methane, dipivaroyl methane, trifluoroacetylacetone, benzoylacetone, or the like), a β-ketonic acid (for example, acetoacetic acid, propyonyl acetate, benzoyl acetate, or the like), a β-ketoester (for example, a lower alkyl ester, such as methyl, propyl or butyl, of the above ketonic acid), an oxyacid (for example, lactic acid, glycolic acid, α-hydroxybutyric acid, salicylic acid, or the like), a lower alkyl ester of the above oxyacid, an oxyketon (for example, diacetone alcohol, acetoin, or the like), a diol, a triol, a higher carboxylic acid, an alkanolamine (for example, diethanolamine, triethanolamine, monoethanolamine), a polyvalent amine or the like may be added as the stabilizer at a (the molecular number of the stabilizer)/(the number of metal atoms) of approximately 0.2 to 3 as necessary.

As the solvent used in the embodiment, ethanol may be used, and the solvent is appropriately determined according to the raw material being used. Generally, it is possible to use a carboxylic acid, an alcohol (for example, propylene glycol which is a polyvalent alcohol), an ester, a ketone (for example, acetone, methyl ethyl ketone), an ether (for example, dimethyl ether, diethyl ether), a cycloalkane (for example, cyclohexane, cyclohexanol), an aromatic-based solvent (for example, benzene, toluene, xylene), other tetrahydrofurane, or a mixed solvent of two or more of the above.

As the carboxylic acid, specifically, n-butyric acid, a-methyl butyrate, i-valeric acid, 2-ethyl butyrate, 2,2-dimethyl butyrate, 3,3-dimethyl butyrate, 2,3-dimethyl butyrate, 3-methylpentanoate, 4-methylpentanoate, 2-ethylpentanoate, 3-ethylpentanoate, 2,2-dimethylpentanoate, 3,3-dimethylpentanoate, 2,3-dimethylpentanoate, 2-ethyl hexanoate or 3-ethyl hexanoate is preferably used.

In addition, as the ester, ethyl acetate, propyl acetate, n-butyl acetate, sec-butyl acetate, tert-butyl acetate, isobutyl acetate, n-amyl acetate, sec-amyl acetate, tert-amyl acetate, isoamyl acetate is preferably used, and, as the alcohol, 1-propanol, 2-propanol, 1-butanol, 2-butanol, isobutyl alcohol, 1-pentanol, 2-pentanol, 2-methyl-2-pentanol or 2-methoxy ethanol is preferably used.

In addition, the PZT-based sol-gel solution may include a β-diketone and a polyvalent alcohol. Among the above, acetyl acetone is particularly preferable as the β-diketone, and propylene glycol is particularly preferable as the polyvalent alcohol.

The PZT-based sol-gel solution manufactured in the above manner is coated on a substrate using the Chemical Solution Deposition (CSD) method, such as a spin coating method, a dip coating method or Liquid Source Misted Chemical Deposition (LSMCD) method, the residual solvent, water, and the like are removed at a predetermined temperature for a predetermined time so as to form a gel film, then, the resultant is calcined and fired, thereby manufacturing a PZT-based ferroelectric thin film.

According to the PZT-based sol-gel solution of the embodiment, since the viscosity is increased by adding a macromolecule, and cracking can be suppressed by adding a formaldehyde-based solvent, it is possible to form a film as relatively thick as 100 nm or more per layer by spin-coating the sol-gel solution once using, for example, a spin coating method, it becomes possible to produce a crack-free and dense PZT film after calcination and firing and provide sufficiently high ferroelectric characteristics, and the production efficiency can be improved.

EXAMPLES

Next, examples of the invention will be described in detail along with comparative examples.

Comparison tests and evaluations were carried out in the following manner.

For PZT films obtained in Examples 1 to 6 and Comparative examples 1 and 2, the layer thicknesses and refractive indexes of the thin films were obtained after calcination and after firing. The results are shown in Table 1. In addition, the cross-sections and surfaces of the PZT films obtained in Examples 1 and 4 and Comparative example 2 were observed. The results are shown in FIGS. 1 to 6.

(1) Layer thickness measurement: the layer thicknesses of the obtained PZT films were measured using a spectroscopic ellipsometer (manufactured by J.A.Woollam Co., Inc.; M-2000), and the measurement results were summarized in Table 1.

(2) Refractive index measurement: the refractive indexes of the PZT films were measured using the spectroscopic ellipsometer, and the measurement results were summarized in Table 1.

Figure 2:
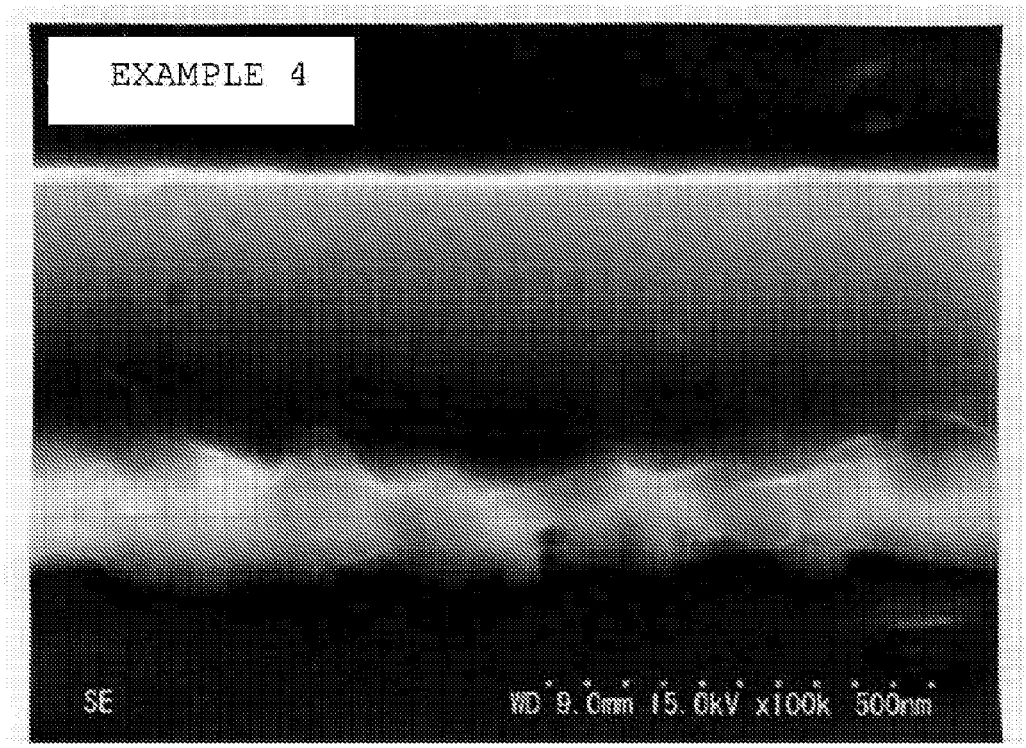
FIG. 2 is an image of a cross-section of a PZT-based ferroelectric thin film according to Example 4 of the invention observed using a SEM photograph.
Figure 3:
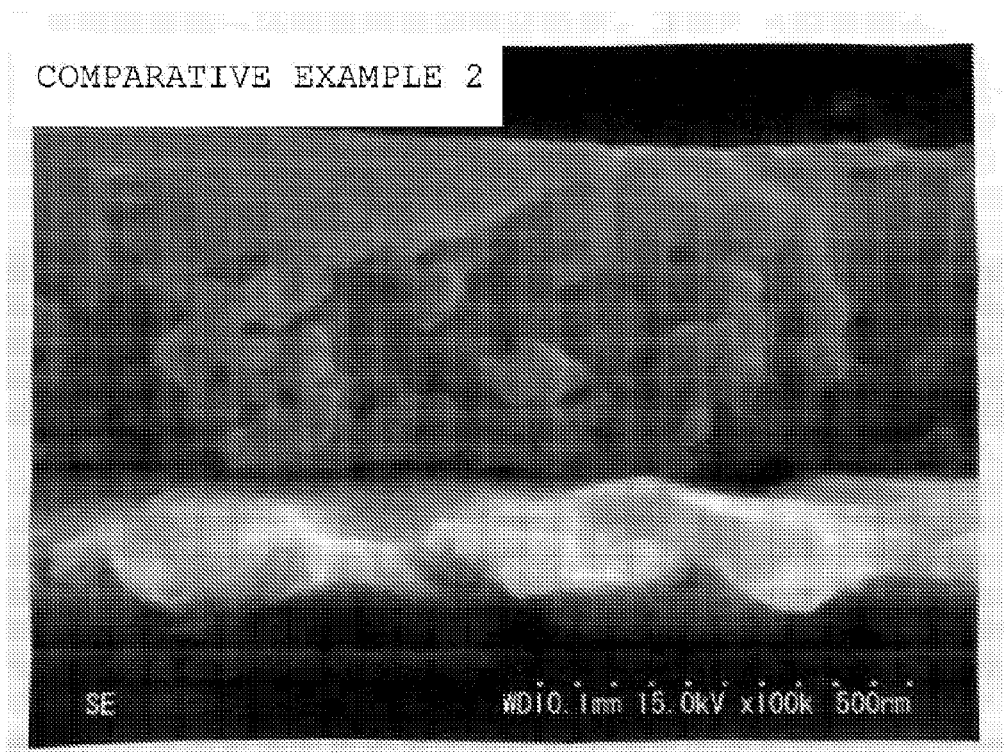
FIG. 3 is an image of a cross-section of a PZT-based ferroelectric thin film according to Comparative example 2 of the related art observed using a SEM photograph.

(3) Cross-section observation: the cross-sections of the obtained PZT films were observed using photographs photographed (at a magnification of 100,000 times) using a SEM (manufactured by Hitachi Science System, Ltd.; S-4300SE). FIGS. 1 and 2 are the cross-section photographs of the PZT films of Examples 2 and 4, and FIG. 3 is the cross-section photograph of Comparative example 2.

Figure 4:
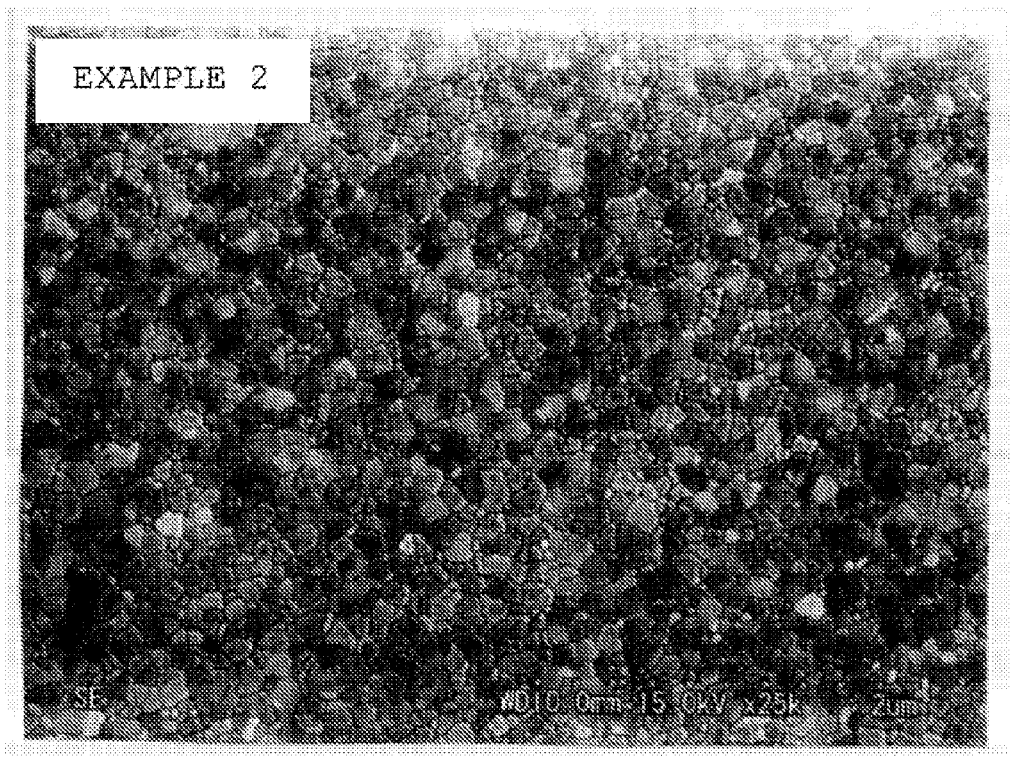
FIG. 4 is an image of a surface of the PZT-based ferroelectric thin film according to Example 2 of the invention observed using a SEM photograph.
Figure 5:
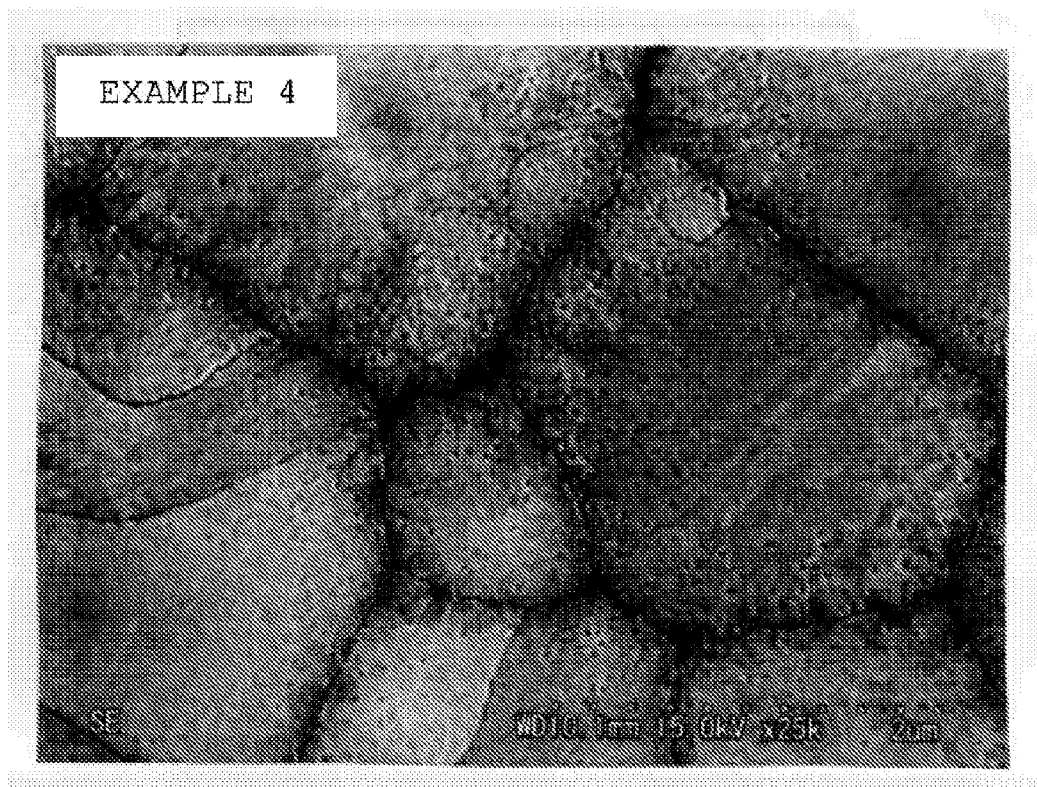
FIG. 5 is an image of a surface of the PZT-based ferroelectric thin film according to Example 4 of the invention observed using a SEM photograph.
Figure 6:
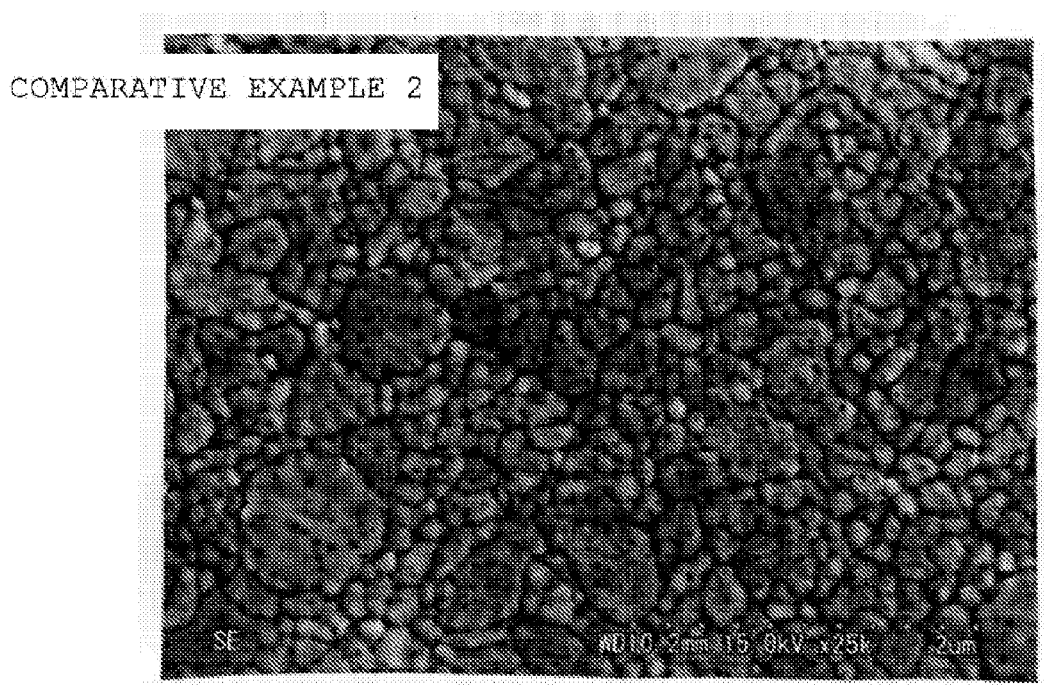
FIG. 6 is an image of a surface of the PZT-based ferroelectric thin film according to Comparative example 2 of the related art observed using a SEM photograph.

(4) Surface observation: the surfaces of the obtained PZT films were observed using photographs photographed (at a magnification of 25,000 times) using a SEM (manufactured by Hitachi Science System, Ltd.; S-4300SE). FIGS. 4 and 5 are the surface photographs of the PZT films of Examples 2 and 4, and FIG. 6 is the surface photograph of Comparative example 2.

Example 1

Polyvinylpyrrolidone (hereinafter referred to as PVP, 0.73 g, k=30) was added to a PZT-based sol-gel solution (50 g) having an ethanol solvent including 25 wt % of PZT as an oxide so as to make PZT:PVP=1:0.2, stirred for 2 hours, and stabilized in a refrigerator (5° C.) for 24 hours. N-methylformamide was added to the solution obtained in the above manner up to 6.5 mass % of the solution, and stirred for 2 hours. The obtained solution was added dropwise onto a Pt film on a substrate manufactured by sequentially forming a $SiO_2$ film, a $TiO_2$ film and a Pt film on a Si substrate (hereinafter referred to as "$Pt/TiO_x/SiO_2/Si$ substrate"), and spin coating was carried out at 2000 rpm for 60 seconds. This substrate was held on a hot plate at 150° C. for 3 minutes, and the residual solvent, water, or the like in the film was removed. The obtained substrate was calcined using a Rapid Thermal Annealing (RTA) treatment. For calcination, the temperature of the substrate was increased to 275° C. at 2.5° C./second, then, the substrate was held for 3 minutes, the temperature was increased to 460° C. at 10° C./second, and the substrate was held for 8 minutes. The refractive index of the obtained film measured at 632.8 nm was 2.45. The substrate was held at 700° C. for 1 minute at a temperature-increase rate of 10° C./second using the RTA treatment so as to be fired. The measured refractive index of the obtained film was 2.51. As a result of forming a Pt upper electrode (200 nm) on the obtained PZT film using sputtering, and measuring the electric characteristics, it could be confirmed that the permittivity at 0 V showed 1320, and the film had a high permittivity. In addition, it was found from the observation using a SEM that the film thickness was 250 nm and the film was a dense PZT film.

Example 2

PVP (0.91 g, k=30) was added to a PZT-based sol-gel solution (50 g) having an ethanol solvent including 25 wt % of PZT as an oxide so as to make PZT:PVP=1:0.25, stirred for 2 hours, and stabilized in a refrigerator (5° C.) for 24 hours. N-methylformamide was added to the solution obtained in the above manner up to 3.0 mass % of the solution, and stirred for 2 hours. The obtained solution was added dropwise onto a Pt film, and spin coating was carried out at 2000 rpm for 60 seconds. This substrate was held on a hot plate at 150° C. for 3 minutes, and the residual solvent, water, or the like in the film was removed. The obtained substrate was calcined using a RTA treatment. For calcination, the temperature of the substrate was increased to 275° C. at 2.5° C./second, then, the substrate was held for 3 minutes, the temperature was increased to 460° C. at 10° C./second, and the substrate was held for 8 minutes. The refractive index of the obtained PZT film measured at 632.8 nm was 2.43. The substrate was held at 700° C. for 1 minute at a temperature-increase rate of 10° C./second using the RTA treatment so as to be fired. The measured refractive index of the obtained PZT film was 2.52.

As a result of forming a Pt upper electrode (200 nm) on the obtained PZT film using sputtering, and measuring the electric characteristics, it could be confirmed that the permittivity at 0 V showed 1380, and the film had a high permittivity. In addition, it was found from the observation using a SEM that the film thickness was 330 nm and the film was a PZT film having a dense columnar structure.

Example 3

PVP (1.64 g, k=30) was added to a PZT-based sol-gel solution (50 g) having an ethanol solvent including 25 wt % of PZT as an oxide so as to make PZT:PVP=1:0.45, stirred for 2 hours, and stabilized in a refrigerator (5° C.) for 24 hours. N-methylformamide was added to the solution obtained in the above manner up to 3.0 mass % of the solution, and stirred for 2 hours. The obtained solution was added dropwise onto a Pt film, and spin coating was carried out at 2000 rpm for 60 seconds. This substrate was held on a hot plate at 150° C. for 3 minutes, and the residual solvent, water, or the like in the film was removed. The obtained substrate was calcined using a RTA treatment. For calcination, the temperature of the substrate was increased to 275° C. at 2.5° C./second, then, the substrate was held for 3 minutes, the temperature was increased to 460° C. at 10° C./second, and the substrate was held for 8 minutes. The refractive index of the obtained PZT film measured at 632.8 nm was 2.45. The substrate was held at 700° C. for 1 minute at a temperature-increase rate of 10° C./second using the RTA treatment so as to be fired. The measured refractive index of the obtained PZT film was 2.45.

As a result of forming a Pt upper electrode (200 nm) on the obtained PZT film using sputtering, and measuring the electric characteristics, it could be confirmed that the permittivity at 0 V showed 1540, and the film had a sufficiently high permittivity. In addition, it was found from the observation using a SEM that the film thickness was 343 nm and the film was a dense. PZT film.

Example 4

PVP (1.64 g, k=30) was added to a PZT-based sol-gel solution (50 g) having an ethanol solvent including 25 wt % of PZT as an oxide so as to make PZT:PVP=1:0.45, stirred for 2 hours, and stabilized in a refrigerator (5° C.) for 24 hours. N-methylformamide was added to the solution obtained in the above manner up to 6.5 mass % of the solution, and stirred for 2 hours. The obtained solution was added dropwise onto a Pt film, and spin coating was carried out at 2000 rpm for 60 seconds. This substrate was held on a hot plate at 150° C. for 3 minutes, and the residual solvent, water, or the like in the film was removed. The obtained substrate was calcined using a RTA treatment. For calcination, the temperature of the substrate was increased to 275° C. at 2.5° C./second, then, the substrate was held for 3 minutes, the temperature was increased to 460° C. at 10° C./second, and the substrate was held for 8 minutes. The refractive index of the obtained PZT film measured at 632.8 nm was 2.40. The substrate was held at 700° C. for 1 minute at a temperature-increase rate of 10° C./second using the RTA treatment so as to be fired. The measured refractive index of the obtained PZT film was 2.52.

As a result of forming a Pt upper electrode (200 nm) on the obtained PZT film using sputtering, and measuring the electric characteristics, it could be confirmed that the permittivity at 0 V showed 1560, and the film had a sufficiently high permittivity. In addition, it was found from the observation using a SEM that the film thickness was 300 nm and the film was a significantly densified PZT film.

Example 5

PVP (1.64 g, k=30) was added to a PZT-based sol-gel solution (50 g) having an ethanol solvent including 25 wt % of PZT as an oxide so as to make PZT:PVP=1:0.45, stirred for 2 hours, and stabilized in a refrigerator (5° C.) for 24 hours. N-methylformamide was added to the solution obtained in the above manner up to 13.0 mass % of the solution, and stirred for 2 hours. The obtained solution was added dropwise onto a Pt film, and spin coating was carried out at 2000 rpm for 60 seconds. This substrate was held on a hot plate at 150° C. for 3 minutes, and the residual solvent, water, or the like in the film was removed. The obtained substrate was calcined using a RTA treatment. For calcination, the temperature of the substrate was increased to 275° C. at 2.5° C./second, then, the substrate was held for 3 minutes, the temperature was increased to 460° C. at 10° C./second, and the substrate was held for 8 minutes. The refractive index of the obtained PZT film measured at 632.8 nm was 2.43. The substrate was held at 700° C. for 1 minute at a temperature-increase rate of 10° C./second using the RTA treatment so as to be fired.

The measured refractive index of the obtained PZT film was 2.43. As a result of forming a Pt upper electrode (200 nm) on the obtained PZT film using sputtering, and measuring the electric characteristics, it could be confirmed that the permittivity at 0 V showed 1530, and the film had a sufficiently high permittivity. In addition, it was found from the observation using a SEM that the film thickness was 270 nm and the film was a dense PZT film.

Example 6

PVP (1.82 g, k=30) was added to a PZT sol-gel solution (50 g) having an ethanol solvent including 25 wt % of PZT as an oxide so as to make PZT:PVP=1:0.5, stirred for 2 hours, and stabilized in a refrigerator (5° C.) for 24 hours. N-methylformamide was added to the solution obtained in the above manner up to 6.5 mass % of the solution, and stirred for 2 hours. The obtained solution was added dropwise onto a Pt film, and spin coating was carried out at 2000 rpm for 60 seconds. This substrate was held on a hot plate at 150° C. for 3 minutes, and the residual solvent, water, or the like in the film was removed. The obtained substrate was calcined using a RTA treatment. For calcination, the temperature of the substrate was increased to 275° C. at 2.5° C./second, then, the substrate was held for 3 minutes, the temperature was increased to 460° C. at 10° C./second, and the substrate was held for 8 minutes. The refractive index of the obtained PZT film measured at 632.8 nm was 2.49. The substrate was held at 700° C. for 1 minute at a temperature-increase rate of 10° C./second using the RTA treatment so as to be fired.

The measured refractive index of the obtained PZT film was 2.49. As a result of forming a Pt upper electrode (200 nm) on the obtained PZT film using sputtering, and measuring the electric characteristics, it could be confirmed that the permittivity at 0 V showed 1510, and the film had a high permittivity. In addition, it was found from the observation using a SEM that the film thickness was 314 nm and the film was a dense film.

Comparative example 1

PVP (0.18 g, k=30) was added to a PZT sol-gel solution (50 g) having an ethanol solvent including 25 wt % of PZT as an oxide so as to make PZT:PVP=1:0.05, stirred for 2 hours, and stabilized in a refrigerator (5° C.) for 24 hours. N-methylformamide was added to the solution obtained in the above manner up to 6.5 mass % of the solution, and stirred for 2 hours. The obtained solution was added dropwise onto a Pt film, and spin coating was carried out at 2000 rpm for 60 seconds. This substrate was held on a hot plate at 150° C. for 3 minutes, and the residual solvent, water, or the like in the film was removed. The obtained substrate was calcined using a RTA treatment. For calcination, the temperature of the substrate was increased to 275° C. at 2.5° C./second, then, the substrate was held for 3 minutes, the temperature was increased to 460° C. at 10° C./second, and the substrate was held for 8 minutes. The refractive index of the obtained PZT film measured at 632.8 nm was 2.43. The substrate was held at 700° C. for 1 minute at a temperature-increase rate of 10° C./second using the RTA treatment so as to be fired.

The measured refractive index of the obtained PZT film was 2.43. As a result of forming a Pt upper electrode (200 nm) on the obtained PZT film using sputtering, and measuring the electric characteristics, the permittivity at 0 V showed 1250. In addition, it was found from the observation using a SEM that the film thickness was 250 nm and cracks were present in the film.

Comparative example 2

PVP (2.73 g, k=30) was added to a PZT sol-gel solution (50 g) having an ethanol solvent including 25 wt % of PZT as an oxide so as to make PZT:PVP=1:0.75, stirred for 2 hours, and stabilized in a refrigerator (5° C.) for 24 hours. N-methylformamide was added to the solution obtained in the above manner up to 6.5 mass % of the solution, and stirred for 2 hours. When the obtained solution was added dropwise onto a Pt film, and spin coating was carried out at 2000 rpm for 60 seconds, the viscosity of the solution was too high such that it became difficult to uniformly coat the solution. This substrate was held on a hot plate at 150° C. for 3 minutes, and the residual solvent, water, or the like in the film was removed. The obtained substrate was calcined using a RTA treatment. For calcination, the temperature of the substrate was increased to 275° C. at 2.5° C./second, then, the substrate was held for 3 minutes, the temperature was increased to 460° C. at 10° C./second, and the substrate was held for 8 minutes.

<General Evaluation>

Table 1 shows that the PZT films of Examples 1 to 6 according to the invention were all superior in terms of the refractive index to the PZT films according to Comparative examples 1 and 2 (refer to Table 1). In addition, comparison between FIGS. 1 and 2 and FIG. 3 and comparison between FIGS. 4 and 5 and FIG. 6 show that the PZT films of Examples 2 and 4 according to the invention were dense films, but the PZT film according to Comparative example 2 was a film deficient in density. In addition, when FIGS. 1 and 2 and FIG. 3 are compared, cracking did not occur in the PZT film of Example 2 according to the invention, but cracking occurred in the PZT film according to Comparative example 2. Thereby, it was found that, when the ferroelectric thin film-forming sol-gel solution of the invention is used as a raw material of a PZT film, it is possible to manufacture the PZT film which has a crack-free and dense film structure and has sufficient practical characteristics.

TABLE 1

|  | PVP addition ratio (to PZT) | Addition amount of N-methyl-formamide [mass %] | Refractive index | Layer thickness after firing [nm] | Presence of occurrence of cracking | Permittivity at 0 [V] |
| --- | --- | --- | --- | --- | --- | --- |
| Example 1 | 0.20 | 6.5 | 2.51 | 250 | No | 1320 |
| Example 2 | 0.25 | 3.0 | 2.52 | 250 | No | 1380 |
| Example 3 | 0.45 | 3.0 | 2.45 | 343 | No | 1540 |
| Example 4 | 0.45 | 6.5 | 2.52 | 300 | No | 1560 |
| Example 5 | 0.45 | 13.0 | 2.43 | 270 | No | 1530 |
| Example 6 | 0.50 | 6.5 | 2.49 | 314 | No | 1510 |
| Comparative example 1 | 0.05 | 6.5 | 2.43 | 200 | Yes | 1250 |
| Comparative example 2 | 0.75 | 6.5 | 2.12 | 480 | Yes | 890 |

INDUSTRIAL APPLICABILITY

The ferroelectric thin film-forming sol-gel solution of the invention can be used as a precursor solution for manufacturing electronic devices and electronic components including ferroelectric bodies, such as thin film piezoelectric devices or thin film capacitors, which require a relatively thick ferroelectric thin film.

The invention claimed is:

1. A ferroelectric thin film-forming sol-gel solution comprising:
   a PZT-based raw material solution;
   a viscosity-adjusting macromolecular compound including polyvinylpyrrolidone; and
   an organic dopant including a formamide-based solvent,
   wherein the PZT-based raw material solution is included at 17 mass % or more in terms of an oxide, a molar ratio of the polyvinylpyrrolidone to the PZT-based raw material solution is PZT-based raw material solution:polyvinylpyrrolidone=1:0.1 to 0.5 in terms of a monomer, and the formamide-based solvent is included at 3 mass % to 13 mass % of the sol-gel solution.

2. The ferroelectric thin film-forming sol-gel solution according to claim 1,
   wherein the formamide-based solvent is formamide, N-methylformamide or N,N-dimethylformamide.

3. The ferroelectric thin film-forming sol-gel solution according to claim 1,
   wherein a k value of the polyvinylpyrrolidone is in a range of 30 to 90.

4. A method of forming a ferroelectric thin film comprising coating a substrate with the ferroelectric thin film-forming sol-gel solution according to claim 1.

5. A method of forming a ferroelectric thin film comprising coating a substrate with the ferroelectric thin film-forming sol-gel solution according to claim 2.

6. A method of forming a ferroelectric thin film comprising coating a substrate with the ferroelectric thin film-forming sol-gel solution according to claim 3.

* * * * *